United States Patent

Davis

[15] 3,649,850

[45] Mar. 14, 1972

[54] CRYSTAL-CONTROLLED SQUARE-WAVE GENERATOR

[72] Inventor: Paul C. Davis, Laureldale, Pa.

[73] Assignee: Bell Telephone Laboratories, Incorporated, Murray Hill, N.J.

[22] Filed: Nov. 26, 1969

[21] Appl. No.: 880,202

[52] U.S. Cl. ................................307/261, 307/237, 328/28, 331/116

[51] Int. Cl. ........................................................H03k 17/00

[58] Field of Search ......................331/116, 159; 328/2 8, 31; 307/261

[56] References Cited

UNITED STATES PATENTS

| | | | |
|---|---|---|---|
| 2,863,048 | 12/1958 | Theall, Jr. et al. | 328/31 |
| 3,078,377 | 2/1963 | Brunschweiger | 328/31 X |
| 3,134,947 | 5/1964 | Charasz | 331/116 X |
| 3,259,761 | 7/1966 | Narud et al. | 330/30 X |
| 3,378,790 | 4/1968 | Bray | 331/116 |

*Primary Examiner*—Donald D. Forrer
*Assistant Examiner*—B. P. Davis
*Attorney*—R. J. Guenther and E. W. Adams, Jr.

[57] ABSTRACT

A crystal, a wideband noninverting amplifier with low input and output impedance, a nonphase-shifting limiter circuit, a level shift and buffer output stage provide a square wave voltage output with a high degree of stability. The crystal is connected in a feedback circuit between the output of the limiter circuit and the input of the amplifier. The limiter circuit contains a pair of emitter-coupled transistors neither one of which is driven into saturation. Cutoff of each of the transistors in the pair provides clipping of the sinusoidal voltage peaks provided at the input of the limiter circuit. The generator contains only transistors, resistors, and a piezoelectric crystal, and is therefore especially suited for integrated circuit use.

2 Claims, 1 Drawing Figure

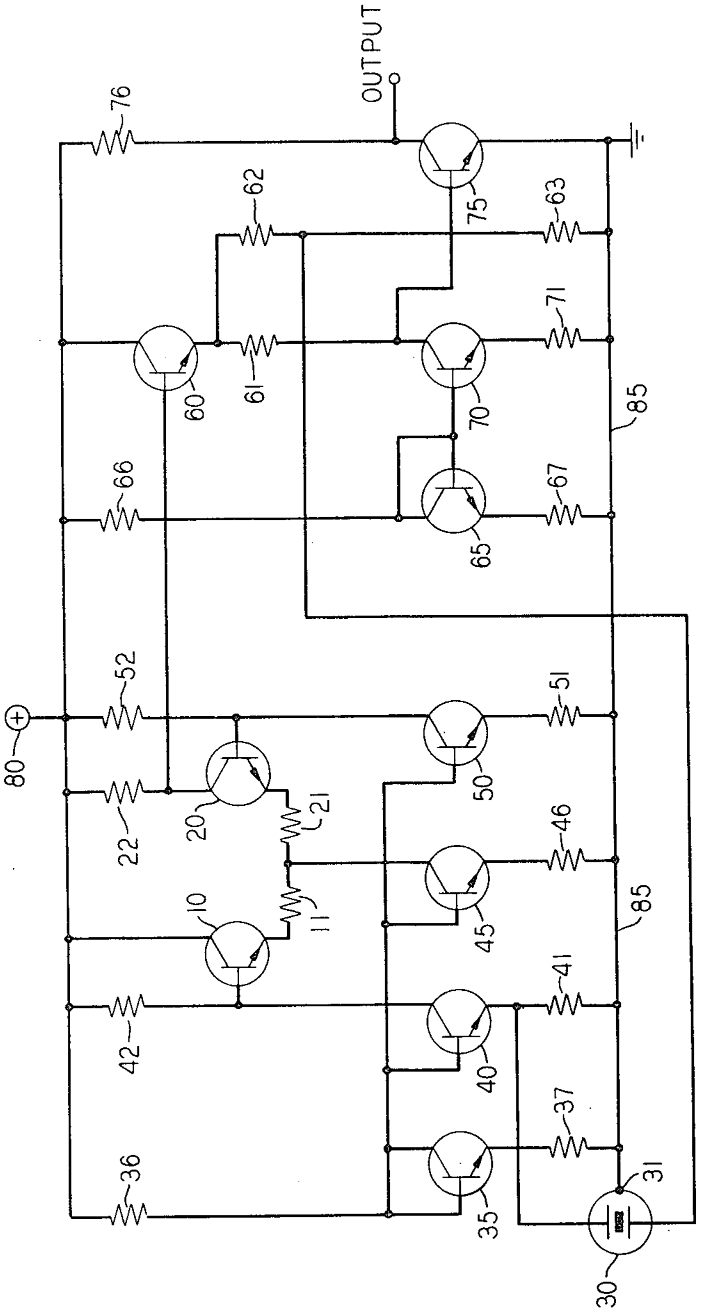
INVENTOR
P. C. DAVIS
BY Daniel D. Dubosky
ATTORNEY

CRYSTAL-CONTROLLED SQUARE WAVE GENERATOR

BACKGROUND OF THE INVENTION

This invention relates to a crystal-controlled oscillator and, more particularly, to a crystal-controlled square wave generating circuit.

In prior art circuits square waves have been generated by first developing a sinusoidal voltage which is then coupled through a voltage-limiting circuit. The sinusoidal voltage is generated in a circuit which contains an active element in combination with a resonant circuit having a capacitive and inductive element. The active element provides energy pulses to the resonant circuit which in turn provides a sinusoidal voltage having a frequency which is determined by the capacitor-inductor combination. As is well known to those skilled in the art, inductive elements and large value capacitors are difficult to produce in the integrated circuit technology.

Still other prior art circuits develop sinusoidal voltages by connecting a crystal as the feedback element in a nonphase-shifting capacitor-coupled amplifier. In this type circuit the loop gain is reduced to unity during oscillation. One method of reducing the gain to unity while maintaining the sine wave shape of a Class A sine wave amplifier is through use of automatic gain control circuits utilizing a PIN diode, FET, a heat controlled resistance, or control of emitter current in a transistor. Each of these schemes involves a time constant long compared to a single cycle of the oscillation. The energy storage element required for this long time constant is not, in general, compatible with monolythic technology.

In still other prior art circuits the limiter circuit is incorporated with the crystal as an element in the oscillator loop. See, for example, U.S. Pat. No. 3,026,487 of Mar. 20, 1962 to J. L. Walsh et al. In this type of circuit limiting is accomplished by driving an active element into saturation during the peaks of the sinusoidal wave. In these circuits the process of saturation introduces sufficient delay such that oscillations do not take place at a predictable deviation from the series resonant frequency of the crystal. In addition, a parallel resonant inductor-capacitor circuit is necessary in the Walsh et al. patent to maintain oscillations.

BRIEF SUMMARY OF THE INVENTION

Accordingly, one object of the present invention is to produce a square wave output voltage from a circuit the frequency of which is controlled by a piezoelectric crystal.

Another object of the present invention is to produce this square wave output voltage by utilizing a circuit having no capacitive or inductive elements.

Still another object is to produce a square wave voltage output from a circuit in which the amount of phase shift is small and predictable such that the resonant frequency of the circuit is substantially equal to that of the series resonant frequency of the piezoelectric crystal.

These objects and others are achieved in accordance with the present invention wherein a piezoelectric crystal is connected between the output and input of an amplifier-limiter circuit in which clipping of the sinusoidal voltage is accomplished through cutoff of alternate transistors in an emitter-coupled pair of transistors. Application of a sinusoidal current from the crystal to the emitter of a common-base transistor amplifier causes a sinusoidal voltage to be coupled to the base of one of the emitter-coupled pair of transistors. Means are provided for biasing both transistors of the emitter-coupled pair into their active region for a range of voltage values on both sides of the sinusoidal point of inflection. As a result, no resonant circuit is necessary to alternately drive each of the transistors of the emitter-coupled pair into the active region. Furthermore, limiting of the sinusoidal peaks is accomplished entirely by the emitter-coupled pair of transistors. Excursion of the sinusoidal voltage toward its maximum level in one direction causes cutoff of one of the transistors in the transistor pair and excursion of the sinusoidal voltage toward the maximum level in the other direction causes cutoff of the other transistor in the emitter-coupled pair of transistors. The trapezoidal waveform appearing at the collector of the other one of the transistors in the transistor pair is then further amplified and clipped in a buffer amplifier stage outside of the oscillator loop.

BRIEF DESCRIPTION OF THE DRAWING

The invention will be more readily understood after reading the following detailed description in conjunction with the drawing which provides a schematic diagram of a crystal-controlled square wave generator constructed in accordance with the present invention.

DETAILED DESCRIPTION

In the drawing a transistor 35 has its base electrode connected to its collector electrode such that it operates as a diode element. This element is shown as a transistor rather than as a diode, however, in order to better illustrate how the entire circuit may be adapted to integrated circuit technology. The current flowing from a DC positive potential source 80 through a resistor 36, through transistor 35 and a resistor 37 to a ground terminal 85 provides a source of reference voltage at the collector electrode of transistor 35. This point of reference potential is connected to the base electrodes of transistors 40, 45, and 50, each of which has its emitter electrode connected to ground through resistors 41, 46, and 51 respectively. Since the base-emitter junction of transistor 35 matches the base-emitter junctions of transistors 40, 45, and 50, and, furthermore, since resistors 37, 41, 46, and 51 are all equal in value, each of these base-emitter junctions are forward-biased by the potential provided at the collector of transistor 35. As a result, each of the transistors 40, 45, and 50 operates as a constant current source to ground through its collector electrode with a value of current equal to $\alpha_0 I_E$, where $I_E$ is the current through its respective base-emitter junction and $\alpha_o$ is the DC short circuit forward transfer current ratio in the common base configuration. This current is to a close approximation equal to the current through resistor 36 since transistors 35, 40, 45, and 50 are essentially identical.

The collector electrode of transistor 40 is connected to the positive potential source 80 through a resistor 42. The current drawn by this collector electrode establishes a predetermined level of DC voltage drop across resistor 42. The collector electrode of transistor 50 is also connected to the positive potential source 80 through a resistor 52 having the same value as resistor 42. Accordingly, since transistors 40 and 50 are matched transistors, the DC potential drop across resistor 52 is equal to the DC potential drop across resistor 42.

A pair of transistors 10 and 20 have their emitter electrodes connected through the series connection of two equal valued resistors 11 and 21. These resistors are advantageously connected between the emitters of transistors 10 and 20 in order to insure that transistors 10 and 20 will operate in the active region for a range of voltage values on both sides of the sinusoidal point of inflection even under less than ideal conditions, for example when either transistors 10 and 20, transistors 40 and 50, or resistors 42 and 52 are not properly matched.

The collector electrode of transistor 10 is connected to the positive potential source 80 with its base electrode connected to the collector of transistor 40. The collector electrode of transistor 20 is connected to the positive potential source 80 through a resistor 22 whereas its base electrode is connected to the collector of transistor 50. Transistor 45 is also matched to transistors 40 and 50 and therefore also presents a current source to ground of $\alpha_0 I_E$ at its collector electrode. The collector electrode of transistor 45 is connected to the junction of the two series connected resistors 11 and 21 connected between the emitters of transistors 10 and 20. If there were no sinusoidal current presented to the emitter electrode of transistor 40, in the manner to be described hereinafter, transistors 10 and 20 would both remain in the active region since both base electrodes of transistors 10 and 20 are presented with the same constant potential; the DC current drawn by the collector electrode of transistor 45 tends to be equally distributed between transistors 10 and 20. Accordingly, with no sinusoidal current present one-half of the DC current into the electrode of transistor 45 tends to be drawn from the collector circuit of transistor 10 whereas the other half of the DC current tends to be drawn through the collector circuit of transistor 20.

The collector of transistor 10 is connected directly to the positive potential source whereas the collector of transistor 20 is connected through resistor 22 having a value equal to that of resistors 42 and 52. As a result, the DC potential drop across resistor 22 in the collector circuit of transistor 20 is equal to about one-half the value of the DC potential drop across either of the resistors 42 or 52 connected between the base electrodes of transistors 10 or 20 respectively and the positive potential source 80.

When a sinusoidal current is provided to the emitter electrode of transistor 40, an amplified sinusoidal voltage is developed in response to this current at the base electrode of transistor 10. As this voltage at the base of transistor 10 increases in value toward the value of the positive potential source 80, transistor 10 becomes forward-biased to a greater degree, and more and more of the current drawn by the collector of transistor 45 tends to be drawn through the collector circuit of transistor 10. Since the collector of transistor 45 continues to draw a constant amount of current, as the current from the emitter electrode of transistor 10 increases, current through the base-emitter junction of transistor 20 decreases. When the potential of the sinusoidal voltage at the base electrode of transistor 10 increases to the value at which all of the current being drawn by the collector of transistor 45 is being supplied by the emitter of transistor 10, transistor 20 will at this point be cut off. Accordingly, the potential at the collector of transistor 20 will have reached its maximum value equal to that provided by the positive potential source 80. For the remainder of the positive peak of the sinusoidal voltage provided at the base of transistor 10, the potential at the collector of transistor 20 will remain at a constant value equal to that provided by the positive potential source 80.

After the positive peak of the sinusoidal voltage has occurred, the voltage at the base of transistor 10 will return to the point at which transistor 20 will again begin to conduct through its base-emitter junction. From this point on for a range of voltage values on both sides of the point of inflection in the sinusoidal voltage, both transistors 10 and 20 are in their active regions, and the potential variation provided at the base of transistor 10 is reproduced at the collector electrode of transistor 20.

As the sinusoidal voltage at the base of transistor 10 decreases in value, less and less current is passed through the base-emitter junction of transistor 10 and, therefore, more of the current drawn by the collector of transistor 45 is obtained from the emitter electrode of transistor 20. When the sinusoidal voltage decreases the potential at the base of transistor 10 to the point where transistor 10 is cut off, all of the current being drawn by the collector electrode of transistor 45 is drawn through transistor 20. At this point the potential at the collector of transistor 20 will have reached its minimum value. This minimum value of potential is substantially equal to the potential at the base of transistor 20 since resistors 22 and 52 are equal in value and the collector currents of transistors 45 and 50 are substantially equal. For any further decreases in potential brought about by the sinusoidal voltage at the base of transistor 10 no further changes will be evident in the potential at the collector electrode of transistor 20. Accordingly, for the negative peak of the sinusoidal voltage the collector of transistor 20 will remain fixed at a potential substantially equal to the potential at its base electrode. Hence, limiting of both the most positive and most negative peaks of the sinusoidal voltage presented to the base of transistor 10 is achieved by cutting off either of the transistors 10 or 20. At no time is either of the transistors driven into saturation in order to achieve the desired limiting action. Cutoff of the transistors in the emitter-coupled pair introduces virtually no phase shift since $f\alpha$ (the alpha cutoff frequency) is much higher than the cutoff due to resistive and capacitive elements in the circuit.

The signal at the collector of transistor 20 is directly connected to the base electrode of transistor 60. Transistor 60 is connected in an emitter-follower arrangement with its collector electrode connected directly to the positive potential source 80 and its emitter electrode connected through various impedances to ground. A transistor 65, like transistor 35, has its collector electrode connected directly to the base electrode so as to provide a diode element. A current flowing from the positive potential source 80 through a resistor 66 through the base-emitter junction of transistor 65 and through a resistor 67 to ground provides a reference potential at the base electrode of transistor 65. This reference potential is connected to the base of a transistor 70 whose emitter electrode is connected through a resistor 71 to ground.

Resistor 71 is equal in value to resistor 67, and, therefore, the collector electrode of transistor 70 provides a constant current source (or sink, if one thinks in terms of conventional current flow) with respect to ground and the positive potential source 80. This current drawn by the collector of transistor 70 is obtained from the emitter electrode of transistor 60 through a resistor 61. The potential drop caused by this current flowing through resistor 61 provides a level change in potential between the emitter electrode of transistor 60 and the collector electrode of transistor 70.

The DC potential achieved at the collector electrode of transistor 70 is such that this point may be directly connected to the base electrode of a transistor 75 whose emitter electrode is directly connected to ground, and the potential provided to this base electrode is nominally midway between the cutoff and saturation potentials of the base-emitter junction of transistor 75. Hence, the trapezoidal waveform developed at the collector of transistor 20 is coupled through the emitter-follower stage utilizing transistor 60 to the base electrode of transistor 75. The collector of transistor 75 is connected through a resistor 76 to the positive potential source 80. The trapezoidal waveform appearing at the base of transistor 75 is sufficiently large in magnitude so as to drive transistor 75 into saturation and beyond cutoff. The phase shifting introduced at this point by the fact that charge is stored during saturation has no effect on the repetition frequency of the square wave since, as will be readily apparent hereinafter, transistor 75 is outside of the oscillator loop. The gain provided by the common-emitter stage utilizing transistor 75 further shapes the trapezoidal waveform into a symmetrical square wave having steep rises and drops in potential during the transition periods.

The emitter electrode of transistor 60 is also connected through a resistor 62 and a resistor 63 in series to ground. A piezoelectric crystal has one of its terminals connected to the junction of these two resistors 62 and 63 and the other one of its terminals connected to the emitter electrode of transistor 40. As a result, resistors 62 and 63 provide a potentiometer type circuit which reduces the peak-to-peak value of the trapezoidal waveform which is applied to the piezoelectric crystal. The value of the voltage drop introduced by this potentiometer circuit is determined by the maximum value of current which may be driven into the piezoelectric crystal taking into consideration the input impedance provided to the piezoelectric crystal by the emitter electrode of transistor 40 and the output impedance provided by resistors 62 and 63. The peak current into the emitter of transistor 40 (and therefore the peak current in crystal 30) is limited by the fact that transistor 40 should always operate in the linear region of its characteristics even for the voltage peaks which occur at the junction of resistors 62 and 63.

The piezoelectric crystal serves as a bandpass filter in permitting only the sinusoidal component of the trapezoidal waveform to be coupled through the crystal into the emitter electrode of transistor 40. To all other voltage components present in the trapezoidal waveform, the crystal presents a much higher impedance. It is only the sinusoidal component whose frequency is substantially equal to that of the series resonant frequency of the piezoelectric crystal which is coupled through the crystal with sufficient gain into the low impedance presented at the emitter electrode of transistor 40 such that oscillations will be maintained at this frequency.

The crystal has a surrounding case which is connected at point 31 to ground. In this way the stray capacitances present at each terminal of the quartz crystal are bypassed to ground rather than being permitted to act in parallel with the piezoelectric crystal. As a result the stray capacitances are not permitted to introduce variations in the frequency at which oscillations take place.

In the embodiment which was constructed to provide square wave oscillations with a fundamental frequency equal to about 500 kHz., the cutoff of the amplifier stage utilizing transistor 40 for the type of transistor element utilized in the embodiment was at about 5 MHz. The amount of phase shift introduced by this stage at 500 kHz. is equal to about 5°. Since the operating frequency is relatively far from cutoff, the 5° phase shift is extremely stable, and furthermore the frequency at which oscillations occur is extremely close to the series resonant frequency of the piezoelectric crystal.

1. Apparatus for limiting the peaks of a voltage waveform having a DC voltage component comprising first and second transistors each having base, emitter, and collector electrodes, first and second impedance means equal in value and series connected between the emitter electrodes of said first and second transistors, a DC voltage source, means for connecting said DC voltage source to the collector electrode of said first transistor, a constant current source connected to the junction of said first and second impedances, means for coupling said voltage waveform having a DC voltage component to the base electrode of said first transistor, a source of DC potential connected to the base electrode of said second transistor and equal in value to said DC voltage component, a third impedance means connected between the collector electrode of said second transistor and said DC voltage source, and means for coupling to an output the voltage waveform generated across said third impedance means; wherein said constant current source includes a third transistor having its collector electrode connected to the junction of said first and second impedance means, its emitter electrode connected through a fourth impedance means to ground potential, and its base electrode connected to a DC reference potential which forward-biases its base-emitter junction; and wherein said source of DC potential connected to the base electrode of said second transistor includes a fourth transistor having its collector electrode connected both to the base of said second transistor and through a fifth impedance means to said DC voltage source, its emitter electrode connected through a sixth impedance means to said ground potential, and its base electrode directly connected to the base electrode of said third transistor. I claim:

2. A crystal-controlled square wave generator comprising a piezoelectric crystal, an amplifier-limiter means having an input and output for providing at its output an amplified peak-clipped replica of a sinusoidal current provided to its input, means for establishing a feedback loop including said crystal between said input and output whereby oscillations are maintained at a frequency substantially equal to the series resonant frequency of said crystal, means for amplifying and further clipping the voltage waveform provided at the output of said amplifier-limiter means, said amplifier-limiter means including a pair of emitter-coupled transistors each one of which is biased to be in the active region for a range of values on both sides of the point of inflection in said sinusoidal current and is cut off by alternate peaks of said sinusoidal current, said amplifier-limiter means further including transistor means for amplifying said sinusoidal current to provide an amplified sinusoidal voltage with a DC voltage component, means for coupling said sinusoidal voltage to a base electrode of one of said pair of emitter-coupled transistors, means for providing a DC potential equal to said DC voltage component to a base electrode of the other one of said pair of emitter-coupled transistors, said transistor means for amplifying said sinusoidal current including a first transistor having its emitter and collector electrodes connected through first and second impedances respectively to opposite terminals of a DC voltage source, and said means for providing a DC potential to a base electrode of the other one of said pair of emitter-coupled transistors including a second transistor having its base electrode connected to the base electrode of said first transistor and its emitter and collector electrodes connected through third and fourth impedances respectively to opposite terminals of said DC voltage source.

* * * * *